(12) United States Patent
Chu et al.

(10) Patent No.: US 6,287,637 B1
(45) Date of Patent: Sep. 11, 2001

(54) MULTI-LAYER APPROACH FOR OPTIMIZING FERROELECTRIC FILM PERFORMANCE

(75) Inventors: Fan Chu, Black Forest; Glen Fox; Brian Eastep, both of Colorado Springs, all of CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/427,644

(22) Filed: Oct. 27, 1999

Related U.S. Application Data

(63) Continuation-in-part of application No. 09/064,465, filed on Apr. 22, 1998, now Pat. No. 6,090,443, which is a continuation-in-part of application No. 08/896,684, filed on Jul. 18, 1997, now Pat. No. 6,080,499.

(51) Int. Cl.[7] .................................................. C23C 14/08
(52) U.S. Cl. .............................. 427/376.2; 427/255.32; 427/377; 204/192.18; 204/192.2; 204/192.22
(58) Field of Search ......................... 427/255.32, 376.2, 427/377; 204/192.18, 192.2, 192.22

(56) References Cited

U.S. PATENT DOCUMENTS

| 5,206,788 |   | 4/1993  | Larson et al. . |
| 5,397,446 |   | 3/1995  | Ishihara et al. . |
| 5,407,855 | * | 4/1995  | Maniar et al. . |
| 5,426,075 |   | 6/1995  | Perino et al. . |
| 5,519,566 |   | 5/1996  | Perino et al. . |
| 5,714,194 |   | 2/1998  | Komai et al. . |
| 5,719,417 |   | 2/1998  | Roeder et al. . |
| 5,811,847 |   | 9/1998  | Joshi et al. . |
| 5,817,170 |   | 10/1998 | Desu et al. . |

FOREIGN PATENT DOCUMENTS

| 2 314 348 A |   | 12/1997 | (GB) . |
| 62161953    |   | 7/1987  | (JP) . |
| 05-347229   | * | 12/1993 | (JP) . |
| 06228736    |   | 8/1994  | (JP) . |
| 7-62933     |   | 3/1995  | (JP) . |
| 07168119    |   | 12/1996 | (JP) . |
| 08340085    |   | 12/1996 | (JP) . |
| 08181358    |   | 1/1998  | (JP) . |
| 10012832    |   | 1/1998  | (JP) . |
| 08215467    |   | 2/1998  | (JP) . |
| 10050960    |   | 2/1998  | (JP) . |
| WO 94/10704 |   | 5/1994  | (WO) . |

OTHER PUBLICATIONS

Jung et al., J. Appl. Phys. 79(12), pp. 9245–9249, Jun. 15, 1996.*
"Influence of Buffer Layers and Excess Pb/Zr+Ti Ratios on Fatigue Characteristics of Sol–Gel Derived Pb(Zr,Ti)03 Thin Films" DOI H. et al., Japanese Journal of Applied Physics May 24–27, 1995, vol. 34 No. 9B, pp. 5105–5112.
Patent Abstracts of Japan, vol. 018, No. 604 (C–1275), Nov. 17, 1994 & JP 06 228736 a TDK Corp., Aug. 16, 1994.
Jung, H.J. et al. "Electrical Characteristics of Heteroprocessed Pb(Zr0.52Ti0.48)03 Films" Journal of Applied Physics, USA, vol. 79, No. 12, Jun. 15, 1996, pp. 9245–9249.

* cited by examiner

*Primary Examiner*—Timothy Meeks
(74) *Attorney, Agent, or Firm*—Peter J. Meza, Esq.; William J. Kubida, Esq.; Carol W. Burton, Esq.

(57) ABSTRACT

A multi-layer ferroelectric thin film includes a nucleation layer, a bulk layer, and an optional cap layer. A thin nucleation layer of a specific composition is implemented on a bottom electrode to optimize ferroelectric crystal orientation and is markedly different from the composition required in the bulk of a ferroelectric film. The bulk film utilizes the established nucleation layer as a foundation for its crystalline growth. A multi-step deposition process is implemented to achieve a desired composition profile. This method also allows for an optional third composition adjustment near the upper surface of the film to ensure compatibility with an upper electrode interface and to compensate for interactions resulting from subsequent processing.

15 Claims, 2 Drawing Sheets

MULTI-LAYER APPROACH FOR OPTIMIZING FERROELECTRIC FILM PERFORMANCE

RELATED APPLICATIONS

This application is a continuation-in-part of my application, which is assigned to the present assignee, having the same title as this application, Ser. No. 09/064,465, which was filed on Apr. 22, 1998, now U.S. Pat. No. 6,090,443, which was a continuation-in-part of my then application also assigned to the present assignee, Ser. No. 08/896,684, which was filed Jul. 18, 1997, now U.S. Pat. No. 6,080,499.

BACKGROUND OF THE INVENTION

This invention relates generally to ferroelectric films. More particularly, the present invention relates to a ferroelectric film having improved electrical characteristics and the corresponding fabrication method for producing the ferroelectric film.

Ferroelectric films are typically used as the dielectric material for a ferroelectric capacitor in a ferroelectric memory cell. For proper memory operation, it is critical that the ferroelectric film achieves desirable electrical performance evidenced by the ability to liberate a detectable charge in response to the application of an externally applied electrical field. It has been shown in the laboratory that crystal growth characteristics and film orientation are critical to achieving this desirable electrical performance. Typically, the ferroelectric film is deposited on a conducting electrode surface, such as the bottom electrode of the ferroelectric capacitor. The bottom electrode can be fabricated from a variety of films such as: platinum, iridium, iridium oxide, ruthenium oxide, palladium, as well as other noble metals and their oxides, or other suitable conductive materials known in the art. Each of these electrodes has a unique surface with changing roughness, and/or conductivity, which dramatically impacts the sticking coefficients for the various components of a subsequently deposited ferroelectric film. As the sticking coefficients vary, the composition of the ferroelectric film varies. As the electrode surface begins to accept a layer of ferroelectric film, the sticking coefficients for the constituents change and dictate the composition of the bulk film. Therefore, the composition required for optimum electrical performance cannot be obtained using a single fixed set of sputtering conditions or solution chemistry.

For subsequent comparison to the improved ferroelectric film of the present invention, a typical prior art ferroelectric PZT film (lead zirconate titanate) having a thickness of about 2400Angstroms and deposited with a single step deposition has roughly 75% of the crystal domains oriented in the <111> crystal orientation. The "switched charge" liberated using a three-volt pulse ["Qsw(3 v)"] was measured at about 21 micro-Coulombs per centimeter squared. The applied voltage at which the switched charge of the ferroelectric capacitor is 90% saturated ["V(90%)"] was measured at about 4.5 volts.

What is desired is a ferroelectric film having optimized electrical performance in which specific adjustments in deposition conditions are made to compensate for the electrode variables described above and to dictate a desired film composition profile.

SUMMARY OF THE INVENTION

It is, therefore, a principal object of the present invention to achieve an optimized composition profile in a ferroelectric film in order to enhance electrical performance.

According to the present invention a thin nucleation layer of a specific composition is implemented to optimize ferroelectric crystal orientation and is markedly different from the composition required in the bulk of the ferroelectric film. The bulk film utilizes the established nucleation layer as a foundation for its crystalline growth. Because of these composition requirements, a multi-step deposition process is implemented to achieve the desired composition profile. The method of the present invention also allows for an optional third composition adjustment near the upper surface of the film to ensure compatibility with an upper electrode interface and to compensate for interactions resulting from subsequent processing.

The foregoing and other objects, features and advantages of the invention will become more readily apparent from the following detailed description of a preferred embodiment of the invention, which proceeds with reference to the accompanying drawing figure.

DETAILED DESCRIPTION

Figure 1:
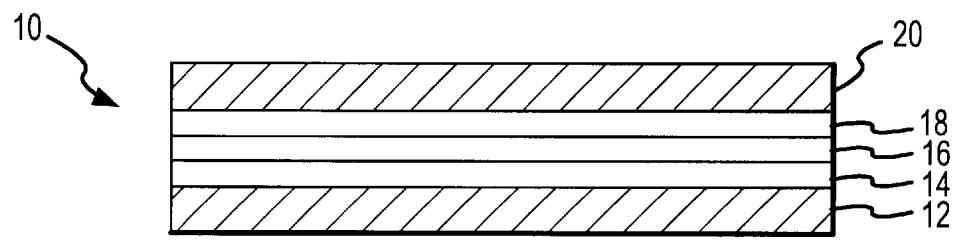
FIG. 1 is a cross-sectional diagram of a multi-layer ferroelectric film in a ferroelectric capacitor manufactured according to the method of the present invention.

Referring now to FIG. 1, a ferroelectric capacitor 10 is shown having a bottom electrode 12, an upper electrode 20, a thin nucleation layer 14, a bulk ferroelectric layer 16, and an optional third or "cap" ferroelectric layer 18. Ferroelectric capacitor 10 can be used as the storage element in a ferroelectric memory cell, which resides in an array of such ferroelectric memory cells.

PZT Sputter Deposition on a Platinum Bottom Electrode Using a Single Target

For optimized electrical performance, the PZT ferroelectric film manufactured according to the present invention is sputter deposited from a single target with a lead-rich ("Pb") nucleation layer 14, followed by a subsequently sputter deposited "lesser" lead-rich bulk layer 16. In order to achieve optimum electrical performance using a single target deposition, the multi-layer approach of the present invention is highly desirable. To achieve a lead-rich nucleation layer 14, high pressure and low power are employed to deposit a film of 50 to 500 Angstroms thick with excess lead of 25 to 35%. After deposition of the nucleation layer 14, the sputter conditions are changed to reduce the lead content for the bulk film layer 16 (10 to 20% excess lead) by lowering pressure and raising power. These combinations of lead in the nucleation layer 14 and bulk layer 16 are critical to ensure proper nucleation and film growth through the subsequent high temperature anneals required to form the desired crystal structure. In these anneals the volatility of lead plays a key role. The high concentrations of lead in the nucleation layer 14 are critical for ensuring an adequate lead supply for crystal formation while maintaining an escape route for the excess lead (i.e. the lower lead bulk layer 16). If the amount of lead in the bulk layer 16 is too excessive it will overwhelm the nucleation layer 14 and disrupt nucleation and crystal growth. If the bulk layer 16 is too lead-deficient, it consumes needed lead from the nucleation layer 14 and again disrupts crystal growth.

In some cases, a lead-rich cap layer 18 is desirable to buffer film degradation during subsequent CMOS processing. If used, the cap layer 18 is ideally sufficiently removed from the nucleation layer 14 to ensure that it does not influence crystal growth. The cap layer 18 is optimized for thickness and lead content to ensure compatibility with top electrode 20. If desired, a multi-layer bottom electrode 12 consisting of platinum and iridium, and a multi-layer top electrode 20 consisting of platinum and iridium oxide can be used. Other layers, such as titanium adhesion layers, can also be used. While platinum is a preferred electrode material, other appropriate electrode materials known in the art can be used as described in the Background of the Invention.

Sputtering Conditions

In the preferred embodiment, the target composition of the PZT sputtering target is as follows: 1.035 lead, 0.400 zirconium, 0.600 titanium, 0.030 lanthanum, 0.050 calcium, and 0.020 strontium. The bottom electrode 12 and top electrode 20 are platinum, each about 1750 Angstroms thick.

It should be noted that the exact sputtering conditions identified below are specific to a given sputtering tool. It is appreciated by those skilled in the art that the exact sputtering conditions will be modified as necessary to accommodate other sputtering tools.

In the preferred embodiment, a Gryphon Sputtering Deposition Tool is used. All layers 14, 16, and 18 are deposited at the same temperature (Room Temperature) and in the same sputter ambient environment (Argon). The sputter conditions for the nucleation layer 14 are 750 watts at an 18 mTorr pressure to produce a film between 50 and 100 Angstroms thick with approximately 30% excess lead. The bulk layer 16 is deposited at 1000 watts at a 2 mTorr pressure to build up the remaining film thickness with an excess lead content of about 15–20%. If an optional cap layer 18 is employed to enhance the top electrode 20 interface characteristics, the bulk layer 16 thickness is reduced by the additional thickness of the cap layer 18. The cap layer 18 is between 200 and 300 Angstroms thick and varies between 25 and 35% excess lead. The sputter conditions for producing the cap layer 18 lead contents are 750 watts at a 10 mTorr pressure for 25% excess lead and 550 watts at an 18 mTorr pressure for 35% excess lead.

Electrical Performance Improvement

A bi-layer ferroelectric film consisting of layers 14 and 16 has a crystal orientation of near 98% of the crystal domains oriented in the <111> orientation, with Qsw(3V) switched charge measured at three volts of about 30 micro-Coulombs per centimeter squared. A V(90%) was measured at about 3.5 volts. Both measurements indicate significant improvement in electrical characteristics over the single-layer ferroelectric film referenced in the Background of the Invention.

PZT Sputter Deposition on a Platinum Bottom Electrode Using Multiple Targets

The multiple layer sputter deposition technique described above can also be implemented using a "cluster tool" with a minimum of two chambers, each containing a sputtering target. In the cluster tool, a first chamber contains a target with higher lead content. The wafer on which the capacitors are built is transferred to the first chamber and the nucleation layer 14 is deposited with, for example, 30% excess lead. After depositing the nucleation layer 14, the wafer is transferred to a second chamber with an alternative target composition. The bulk layer 16 is subsequently deposited in the second chamber with, for example, 15–20% excess lead. An additional third chamber and target, or the first chamber and target, can be used to deposit the cap layer 18, if desired.

Solution Chemistry or CVD ("Chemical Vapor Deposition")

In general, the same principles of composition control, for specific regions of the ferroelectric film, apply to both solution chemistry and CVD techniques. In both cases, a composition change is required for each of the layers. For example, in solution chemistry for the PZT example above, solutions with three different lead contents and potentially varying viscosities (or, at a minimum, different spin speeds) are required to achieve the desired film compositions and thickness targets. For CVD, the flow rates for the critical precursors are ideally changed for each of the layers. In all cases, whether the film is crystallized in situ or in a separate anneal step, controlling the composition of the nucleation layer 14 independent of the bulk layer 16 is critical in establishing optimum crystal growth and orientation for ferroelectric electrical performance.

Other Ferroelectric Materials

The techniques described herein can also be easily applied to other types of ferroelectric materials. One material that may have promise as a suitable ferroelectric material is strontium bismuth tantalate ("SBT"). The volatile component, or "A" site Perovskite lattice constituent is bismuth, which, similarly to lead in the PZT ferroelectric film, plays a critical role in electrical performance and the orientation of the film. The multi-layer approach taught herein is anticipated to provide the same potential benefits regarding an improvement in electrical performance. A bismuth-rich nucleation layer 14 is used, followed by a relatively bismuth-poor bulk layer 16. If desired, an optional cap layer 18 can be used as in the previous examples.

Enhancements in PZT Texturing for Low Voltage Ferroelectric Performance

According to another method of the present invention, a specific anneal sequence is utilized after PZT deposition to control the crystalline texturing of the film, and by doing so, enhancing low voltage performance. In general, "texturing" is defined as preferred orientation and grain structure. This is accomplished by modifying the lead content in the PZT film to take advantage of specific phase formations that enhance PZT texturing. A multi-layer PZT is utilized to obtain a specific lead profile, with an associated anneal sequence to take advantage of that profile. The anneal sequences involve a two step process wherein a first step utilizes a low temperature argon ambient anneal to drive the formation of a platinum-lead and platinum-titanate intermetallic phases at the bottom electrode interface and a second step utilizes an oxygen anneal to complete the PZT crystallization process.

The multi-layer processing of the present invention is used because considerably more lead is required near the bottom electrode interface to supply the platinum-lead intermetallic layer; this high level of lead cannot be sustained in the bulk of the PZT film without an adverse impact on the kinetics driving crystal formation. The argon ambient anneal is used in the first step to prevent over saturation of the bottom electrode interface with oxygen. Excessive oxygen shuts down the desirable platinum-lead phase and favors an undesirable lead oxide (PbO) phase, which has a detrimental impact on PZT texture. By using the argon sequence of the present invention to establish the platinum-lead and platinum titanate intermetallic phases, the energy required to produce a favorable texture during the oxygen anneal sequence can be reduced. Since the required energy is reduced, the stress/strain relationships on the lattice are reduced and the crystal forms along preferred orientations dictated by the nucleation foundation layer. Depending upon the PZT dopants used, the argon anneal generates a strong <111> orientation preference or a mixed texturing of <001> and <111> orientations. In particular, the quality of the <001> texturing directly influences the low voltage performance of the film. An additional benefit of reducing the energy requirements for the anneal is the conservation of lead in the bulk of the film. This conservation of lead enhances fatigue performance.

The argon and oxygen anneal sequence of the present invention can be modified by the addition of certain dopant materials to further enhance low voltage performance. A PZT film can be doped with lanthanum, calcium, and strontium dopants to achieve low voltage ferroelectric operation. Operation as low as three volts has been demonstrated, and the potential exists for operation at even lower voltages less than three volts. In addition, the argon and oxygen anneal described herein can be applied to other ferroelectric compositions as well as with other electrode structures and materials.

Utilizing the multi-layer PZT structure in conjunction with the two step anneal process enhances ferroelectric performance by establishing sufficient lead in the nucleation layer to adequately establish the intermetallic phases of lead platinum (Pb—Pt) and lead titanate (Pb—Ti). These phases provide the foundation and seeding for proper PZT nucleation with orientation for optimum ferroelectric performance. The nucleation layer is kept thin (about 100 to 200 Angstroms) and lead rich (30%±5%) and provides the lead necessary to complete the phase interactions for the time and temperature window of the argon portion of the anneal. The argon anneal step is desirable to enhance the Pb—Pt and Pb—Ti interactions without the presence of oxygen. Typically, oxygen-only anneals overrun these interactions with the formation of PbO (lead oxide), which disrupts the preferred phase formations. The PbO formation is detrimental to preferred crystal orientation (<100> and <110> mixed orientations). After the argon portion of the anneal, the foundation is set for good crystal orientation, <111> and <001>, but the lattice remains oxygen deficient. The second anneal is done in an oxygen ambient atmosphere to complete the crystal formation, which is now driven by the foundation established with the argon anneal. The oxygen anneal fills the oxygen vacancies and completes the crystalline structure for the bulk of the film. The bulk of the PZT film can not be as lead rich (bulk layer lead =15%±5%) as the nucleation layer or excessive amounts of PbO would be generated during the oxygen anneal and again disrupt preferred crystal orientation in the bulk of the film.

Process Flow Details

PZT is deposited on a bottom electrode consisting of a 200 Angstrom titanium sticking layer and 1750 Angstrom platinum layer. The PZT deposition is done in a Gryphon Deposition Tool, modified for RF. The PZT film utilized consisted of a proprietary "CS" composition (Pb/Zr/Ti/La/Ca/Sr) and is deposited using a multi-layer approach. However, the benefits of the multi-layer film structure and anneal sequence of the present invention is not exclusively limited to the "CS" composition referred to above. PZT doped with only lanthanum shows improvement using the method of the present invention. The "CS" PZT composition is described in further detail in co-pending patent applications assigned to the present assignee having Ser. Nos. 08/620,799 and 08/861,674, both of which are entitled "Use of Calcium and Strontium Dopants to Improve Retention Performance in a PZT Ferroelectric Film", and both of which are hereby incorporated by this reference. The nucleation layer is deposited at an energy of 700 watts, at a pressure of 18 mTorr for about five minutes, resulting in a film thickness of about 150 Angstroms, with about 30% excess lead. The bulk layer is deposited at an energy of 1000 watts, at a pressure of six mTorr for between 17 to 45 minutes, resulting in films from about 850 to 2350 Angstroms thick with between 8% and 18% excess lead. If desired, an additional cap layer can be deposited at an energy of 700 watts, at a pressure of 30 mTorr, for about eight minutes, resulting in a film about 200 to 300 Angstroms thick with about 25% to 40% excess lead. After deposition of the bi-layer or tri-layer PZT film, the entire film is annealed in a AG Heatpulse 410 RTA (rapid thermal anneal) system with the following anneal sequence:

Step 1 (Argon Anneal)

Argon ambient atmosphere;
Sixty second delay;
Ramp temperature to 625° C. at 200° C./sec;
Hold temperature at 625° C. for 90 seconds;
Turn off heat lamps and let cool to 300° C.; and
Remove from RTA chamber.

Step 2 (Oxygen Anneal)

Oxygen ambient atmosphere;
Sixty second delay;
Ramp temperature to 750° C. at 125° C./sec;
Hold temperature at 750° C. for 20 seconds;
Turn off heat lamps and let cool to 300° C.;
Remove from RTA chamber.

After annealing, the wafer receives a top electrode deposition (1750 Angstroms of platinum), patterning and etch followed by a furnace anneal process at 650° C. for 60 minutes in an oxygen ambient atmosphere, at which point the wafer is ready for electrical testing.

PZT Thin Films Crystallized in reduced $O_2$ Partial Pressure Ambient

The main object of this embodiment of the present invention is the application of reduced $O_2$ partial pressure ambient during PZT thin film crystallization. Crystallizing PZT thin films in reduced $O_2$ partial pressure ambient results in better ferroelectric performance, cross wafer uniformity and wafer-to-wafer repeatability compared with pure $O_2$ crystallization ambient.

Ferroelectric PZT [Pb(Zr,Ti)$O_3$] thin film is one of the key components in FRAM® technology. After being deposited on a substrate, the PZT thin film needs to be annealed at elevated temperature, such as 600° C., to form a polycrystalline thin film with a complex perovskite structure. Since PbO is very volatile at high temperature, say above 500° C., the lead loss in the area close to the surface of the PZT film is higher than that in the bulk of the PZT film, resulting in a non-uniform distribution of lead in the direction of the thickness of the film. Adding excess lead in the PZT film before crystallization may compensate the lead loss in the surface area during high temperature anneal and form the perovskite phase. However, the lead content in the bulk of the PZT film may be too high. It may be difficult for lead to diffuse out of the film as the perovskite phase may block the migration of lead cations. Since the Pb—O bonding in PbO is much weaker than that in a perovskite structure, it is therefore more difficult for lead cations to migrate through a perovskite phase. One way to increase the mobility of lead cations in a perovskite phase is to generate oxygen vacancies in the perovskite structure. It is known that the perovskite structure can tolerate vacancy concentration up to 20%. It is therefore possible to crystallize as-sputtered PZT film in a reduced $O_2$ partial pressure ambient so that the perovskite structure can still form but with a large amount of $O_2$ vacancies embedded in the structure. $O_2$ vacancies provide effective paths for lead cations to migrate in the film during high temperature sintering, giving rise to a more uniform lead distribution and more homogeneous formation of a perovskite phase.

There are two ways to generate a reduced $O_2$ partial pressure ambient. One is to use vacuum environment and flow a small amount of $O_2$ gas into the annealing chamber. Another way, according to the present invention, is to simultaneously flow $O_2$ and another type of gas that will not react with PZT film, such as argon, into the annealing chamber during high temperature crystallization. Method one requires an expensive pumping system and a good vacuum control system. Method two according to the present invention only requires mass flow controllers and a reasonable seal of the annealing chamber.

The assignee of the present invention, Ramtron International Corp. has used Argon rich ambient gas to crystallize PZT films for FRAM applications and parts containing PZT film annealed in an Argon/oxygen ambient atmosphere have been built and evaluated. The oxygen partial pressure in Ramtron's RTA (Rapid Thermal Anneal) chamber is in the range of $10^{-4}$ to 100 Torr.

Experiments have been conducted to evaluate the ferroelectric performance of PZT films crystallized in the Argon rich ambient according to the present invention ($Ar/O_2$ mixture followed by $O_2$ anneal—herein $Ar/O_2$ then $O_2$), and for comparison, $O_2$ only ambient followed by $O_2$ anneal—herein $O_2$ then $O_2$. FIGS. 2($a$), ($b$), ($c$), and ($d$) show the comparison of switched charge V(90%), switched charge loss, and opposite state charge aging rate for the two types of PZT films it can be seen that the PZT films crystallized in the combined Argon and $O_2$ ambient of the present invention (i.e., $Ar/O_2$ then $O_2$) indeed show better ferroelectric performance compared with samples crystallized in the $O_2$ ambient (i.e., $O_2$ then $O_2$) (that is, higher switch charge ($Q_{SW}$), lower $V_{90}$%, lower $Q_{SW}$ loss @ $10^9$ cycles, and comparable opposite state switched charge aging rate).

A PZT ferroelectric thin film annealed according to the present invention had a five-volt switched charge of greater than 35 $\mu C/cm^2$, a V(90%) of less than 3.5 volts, a five-volt switched charge loss at $10^9$ switching cycles of less than 45 percent, and an opposite state switched charge loss rate about –5 percent.

Figure 3:
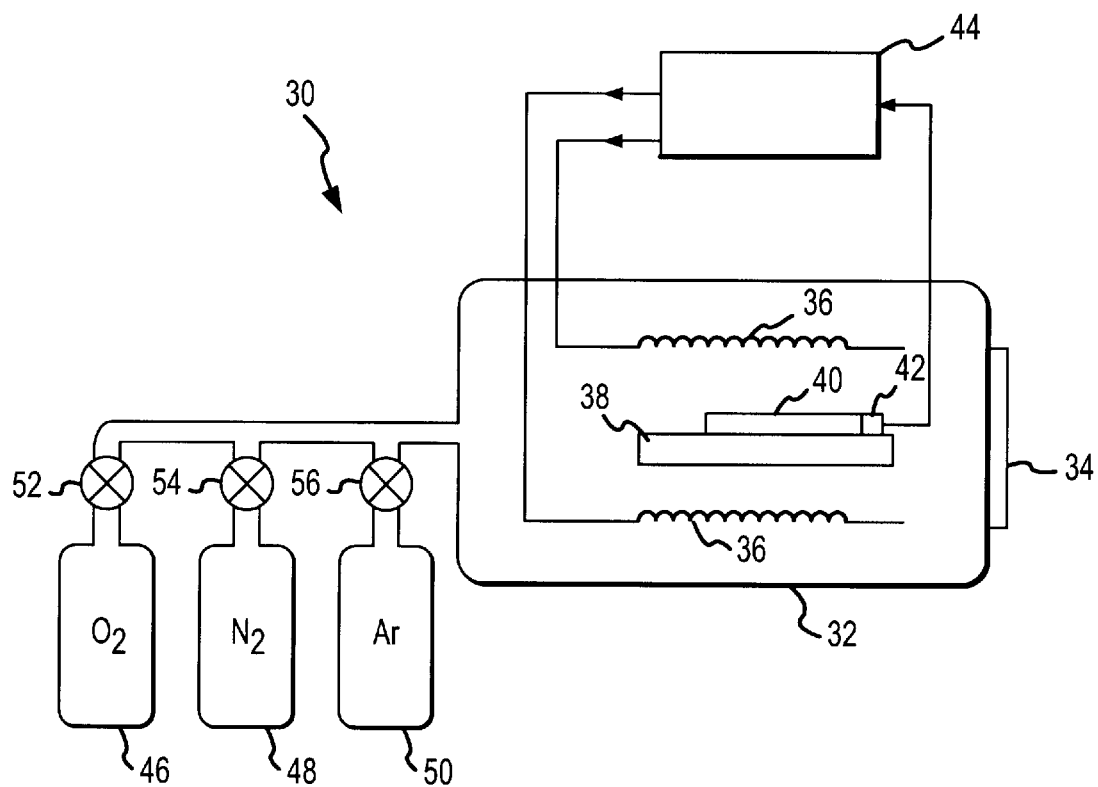
FIG. 3 is a diagram of an RTA chamber for annealing wafers according to the present invention.
Figure 2A:
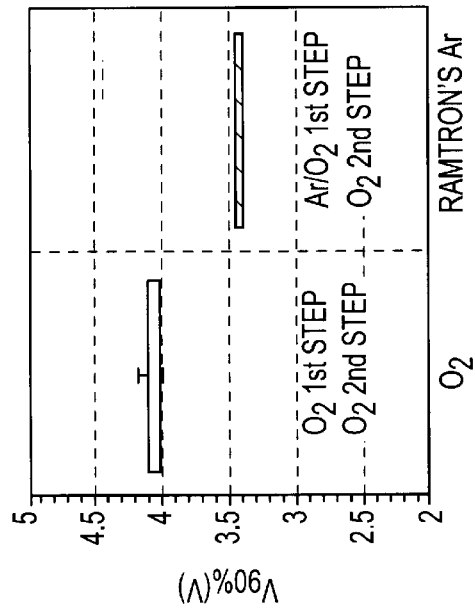
FIGS. 2(a), (b), (c), and (d) show the comparison of switched charge, V(90%), switched charge loss, and opposite state charge aging rate for the two types of PZT films, one of which is annealed in an oxygen ambient atmosphere, the other of which is annealed in a combined ambient atmosphere of argon and oxygen.
Figure 2C:
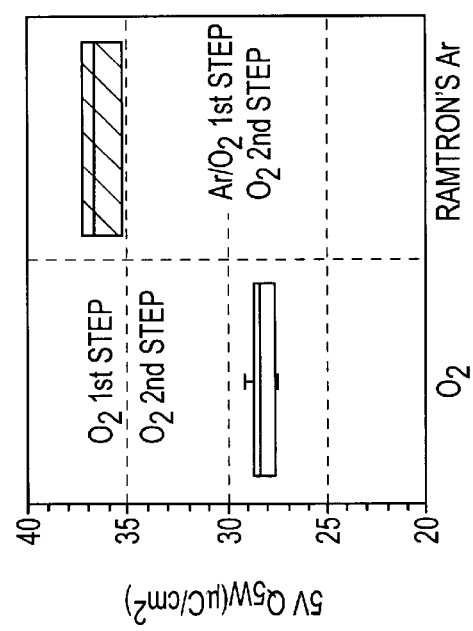
Figure 2B:
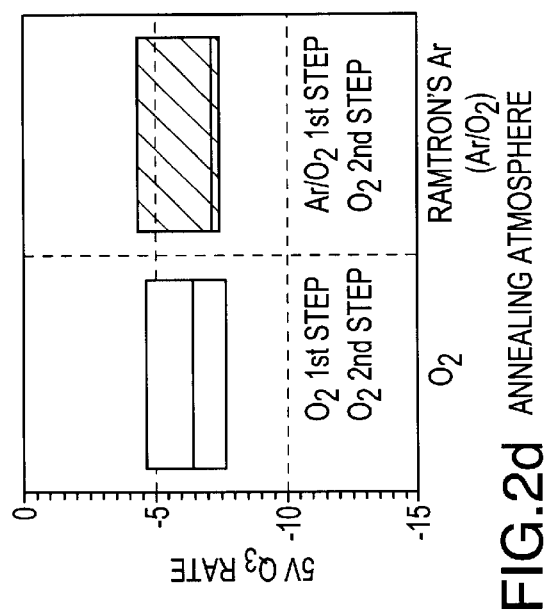
Figure 2D:
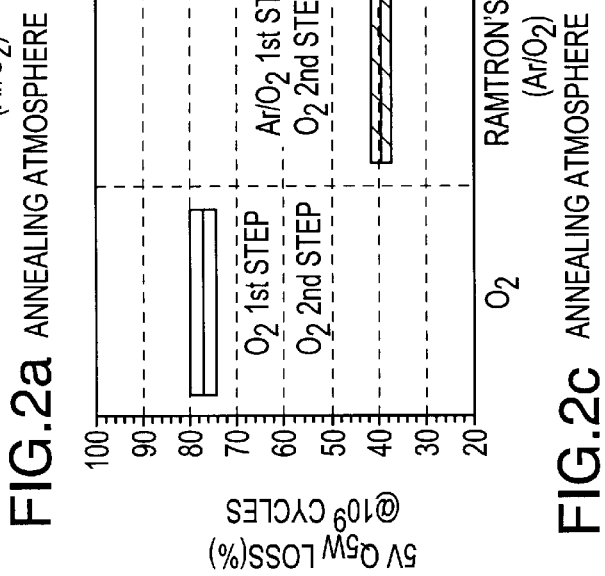

FIG. 3 is a diagram of an RTA (Rapid Thermal Anneal) chamber for annealing a PZT wafer according to the present invention. An RTA chamber 32 includes heating coils 36 powered by a heating control unit 44. The RTA chamber 32 further includes a substrate or platform 38 for supporting a PZT wafer 40. A thermocouple 42 provides feedback to heating control unit 44. The RTA chamber 32 further includes a door 34 for introducing the wafer to the chamber. Annealing gasses are provided through oxygen cannister 46, nitrogen cannister 48, and oxygen cannister 50, which are introduced to the RTA chamber 32 under control of valves 52, 54, and 56, as required.

It is important to note that the combined argon and oxygen anneal of the present invention can be used on either single layer, bi-layer, or tri-layer PZT films. Also, other inert gasses besides argon can be used, such as nitrogen or helium, or the like. The exact temperature and partial pressure of oxygen can be changed as required. A second anneal in oxygen can also be performed.

Having described and illustrated the principle of the invention in a preferred embodiment thereof, it is appreciated by those having skill in the art that the invention can be modified in arrangement and detail without departing from such principles. For example, if desired, the method of fabricating a ferroelectric multi-layer thin film according to the present invention can be modified to include only a single PZT layer, followed by the steps of annealing the single PZT layer in an argon ambient atmosphere, and then annealing the single PZT layer in an oxygen ambient atmosphere. Improvements in performance will still be obtained, even though a single PZT layer is used. We therefore claim all modifications and variations coming within the spirit and scope of the following claims.

We claim:

1. A method of fabricating a ferroelectric thin film comprising:

forming a PZT film on a substrate;

annealing the PZT film in a combined argon and oxygen ambient atmosphere during PZT thin film crystallization; and thereafter annealing the PZT film in an oxygen ambient atmosphere.

2. The method of claim 1 in which forming a PZT film comprises forming a single layer PZT film.

3. The method of claim 1 in which forming a PZT film comprises forming a bi-layer PZT film.

4. The method of claim 1 in which forming a PZT film comprises forming a tri-layer PZT film.

5. The method of claim 1 in which the first annealing step is performed at a temperature above 500° C.

6. The method of claim 5 in which the first annealing step is performed at a temperature of about 600° C. to form a polycrystalline thin film with a complex perovskite structure.

7. A method of fabricating a PZT ferroelectric thin film comprising the steps of:

simultaneously flowing $O_2$ and a second gas that does not react with PZT into an annealing chamber during high temperature crystallization of the PZT ferroelectric thin film; and thereafter flowing $O_2$ alone into the annealing chamber.

8. The method of claim 7 in which the second gas is argon.

9. The method of claim 7 in which the second gas is nitrogen.

10. The method of claim 7 in which the second gas is helium.

11. The method of claim 7 in which the second gas is an inert gas.

12. The method of claim 7 in which the oxygen partial pressure in the annealing chamber during said high temperature crystallizaton is in the range of $10^{-4}$ to 100 Torr.

13. The method of claim 7 in which forming a PZT film comprises forming a single layer PZT film.

14. The method of claim 7 in which forming a PZT film comprises forming a bi-layer PZT film.

15. The method of claim 7 in which forming a PZT film comprises forming a tri-layer PZT film.

* * * * *